(12) United States Patent
Yen

(10) Patent No.: US 7,280,164 B2
(45) Date of Patent: Oct. 9, 2007

(54) APPARATUS FOR CHANNEL SCANNING AND METHOD THEREOF

(75) Inventor: Kuang-Yu Yen, Tai-Chung (TW)

(73) Assignee: Realtek Semiconductor Corp., HsinChu (TW)

(*) Notice: Subject to any disclaimer, the term of this patent is extended or adjusted under 35 U.S.C. 154(b) by 576 days.

(21) Appl. No.: 10/709,447

(22) Filed: May 6, 2004

(65) Prior Publication Data

US 2005/0078225 A1 Apr. 14, 2005

(30) Foreign Application Priority Data

Oct. 14, 2003 (TW) .............................. 92128438 A

(51) Int. Cl.
*H04B 1/26* (2006.01)

(52) U.S. Cl. .................. 348/732; 348/725; 348/731; 725/38

(58) Field of Classification Search ............... 348/731, 348/725–726, 732, 678; 455/161.1, 161.3, 455/260, 164.1, 165.1, 169.1, 226.1, 226.2; 725/38; *H04B 5/50*

See application file for complete search history.

(56) References Cited

U.S. PATENT DOCUMENTS

| 4,896,102 A * | 1/1990 | DuBois .................. 324/76.28 |
| 4,939,789 A * | 7/1990 | Sakashita et al. ........... 455/260 |
| 5,621,767 A * | 4/1997 | Brandt et al. ................ 375/344 |
| 6,038,433 A * | 3/2000 | Vegt ........................ 455/161.1 |
| 6,297,858 B1 * | 10/2001 | Yang .......................... 348/731 |
| 6,816,715 B1 * | 11/2004 | Mano ....................... 455/161.3 |
| 7,080,393 B2 * | 7/2006 | Morisada et al. .............. 725/38 |
| 2004/0028123 A1 * | 2/2004 | Sugar et al. ................. 375/224 |

* cited by examiner

*Primary Examiner*—Trang U. Tran
(74) *Attorney, Agent, or Firm*—Winston Hsu

(57) ABSTRACT

A method for scanning at least a channel of a received signal includes scanning a plurality of frequency bands in sequence and analyzing each frequency band to determine if the frequency band holds the received signal. If it does, the method includes detecting a frequency response of the received signal and detecting a channel characteristic of a channel according to the frequency response of the received signal. The received signal corresponds to the channel.

15 Claims, 4 Drawing Sheets

APPARATUS FOR CHANNEL SCANNING AND METHOD THEREOF

BACKGROUND OF INVENTION

1. Field of the Invention

The invention relates to a method for a channel scanning device and method thereof, and more particularly, to a channel scanning device for quickly scanning channels and method thereof.

2. Description of the Prior Art

When proceeding with channel-searching operations related to the wireless/wiring TV broadcasting, users can make use of a tuner to determine a predetermined channel first and then utilize the receiver to receive video/audio signals transmitted via the channel. Therefore, the users require the predetermined channel for transmitting the video/audio signals in advance or adjust the tuner by hand to receive the video/audio signals. When the video/audio signals are transmitted by the satellite, the carrier position of the channel, the symbol rate, and the encoding operation may occasionally vary in order to improve the performance and efficiency of the satellite; that is, the users have to refresh the related parameters of the channels, which are inputted into the tuner in advance, so that the tuner can be used to check whether it holds the video/audio signal. Otherwise, the receiver has to predict whether the video/audio signal exists according to various carrier positions and symbol rates in order to search the channel. According to above-mentioned prior-art technique, the receiver is likely to spend too much time to achieve the channel-searching operations.

Since the requirements towards the digital TV broadcasting will significantly increase in the near future, the above-mentioned problem related to the variation of characteristics of the channel may be aggravated when the video/audio signal is transmitted by the satellite. Therefore, the rate of the channel-searching operation may become the bottleneck of the performance of the receiver.

SUMMARY OF INVENTION

It is therefore a primary objective of the claimed invention to provide a method and related apparatus for efficiently searching at least a channel in a receiver to solve the above-mentioned problems.

According to the claimed invention, a method for automatically scanning at least a channel of a received signal includes scanning a plurality of frequency bands and analyzing each frequency band to determine if the frequency band holds the received signal. If it does, the method includes detecting a frequency response of the received signal and detecting a characteristic of a channel according to the frequency response of the received signal. The received signal corresponds to the channel.

According to the claimed invention, a receiver for automatically scanning at least a channel of a received signal comprises a tuner for scanning a plurality of frequency bands in sequence, a signal detecting unit for analyzing each frequency band to determine if the frequency band holds the received signal, a spectrum analyzer for detecting a frequency response of the received signal, and a channel-parameter detecting unit for detecting a characteristic of the channel according to the frequency response of the received signal. The received signal corresponds to the channel.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
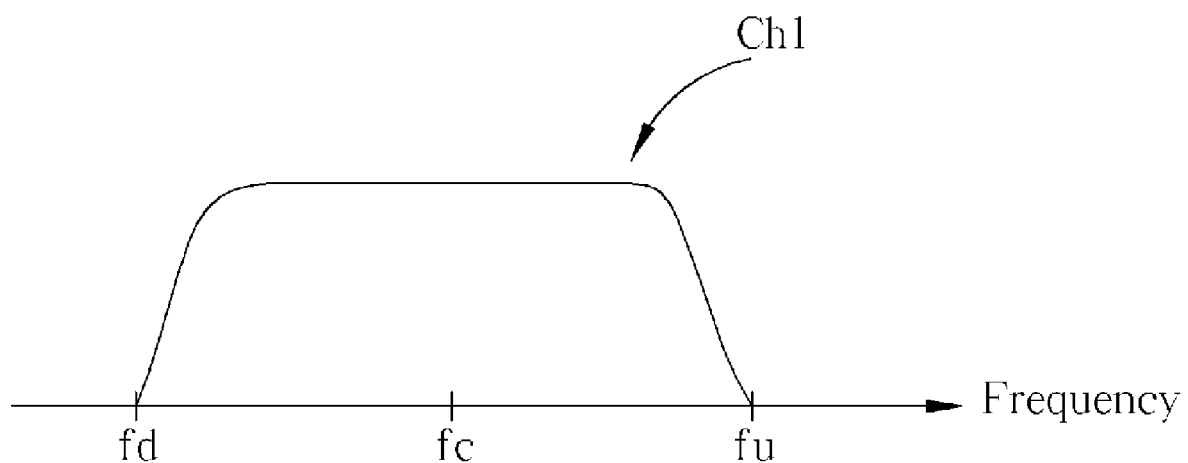
FIG. 1 is a schematic diagram of the frequency response of a received signal corresponding to a channel.

According to the present invention, a received signal is transformed from a time-domain signal into a frequency-domain signal to acquire a frequency response of the received signal in frequency domain, and then the frequency response can be used to determine the parameters, such as a position of the carrier and a symbol rate, of the received channel. Please refer to FIG. 1, which is a schematic diagram of the frequency response of a received signal corresponding to a channel Ch1. As shown in FIG. 1, in the frequency domain, the channel Ch1 corresponds to a maximum edge frequency fu and a minimum edge frequency fd, and the maximum edge frequency fu and the minimum edge frequency fd can be used to determine a position of the carrier fc and a symbol rate R. The position of the carrier fc is an arithmetic mean of the two edge frequencies fu and fd according to a following equation: $f_{c3}=(f_{u3}+f_{d3})/2$, while the symbol rate R can be determined by a difference of the two edge frequencies fu and fd according to a following equation: $R=(f_{u3}-f_{d3})/(1+\text{Roll-off factor})$.

Figure 2:
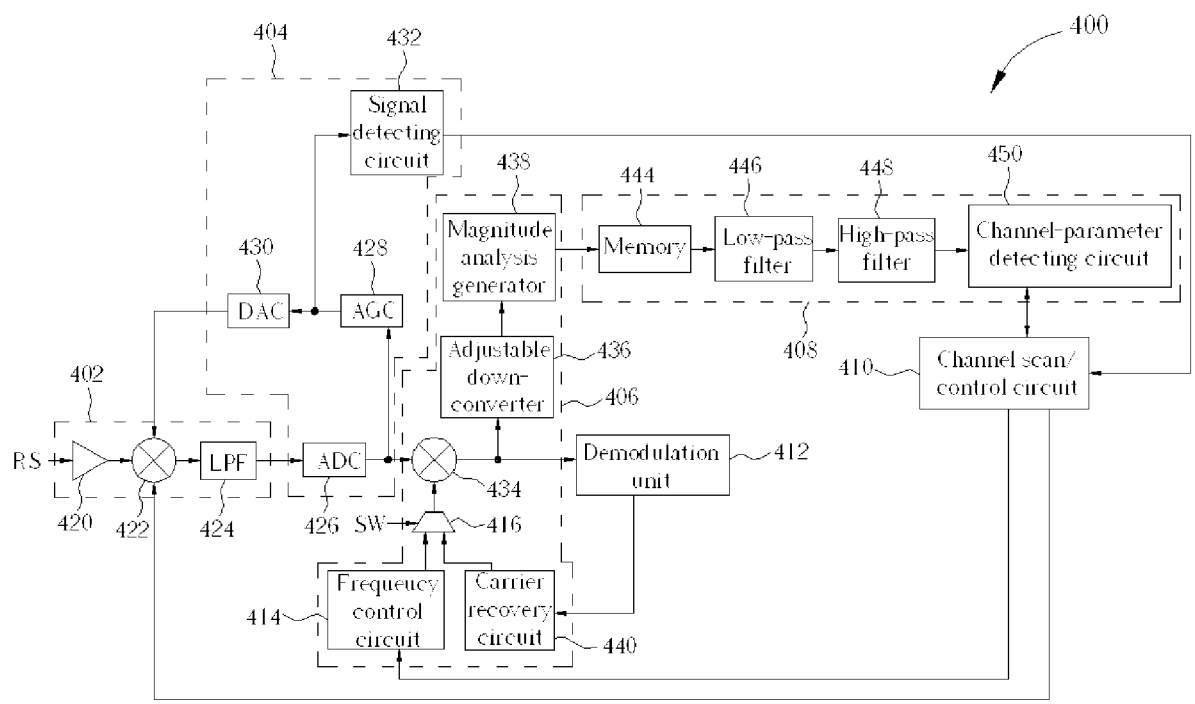
FIG. 2 is a systematic structure diagram of a preferred embodiment showing a receiver with an automatic channel-scanning function according to the present invention.

Please refer to FIG. 2, which is a systematic structure diagram of a preferred embodiment showing a receiver with an automatic channel-scanning function according to the present invention. The receiver 400 includes a tuner 402, a signal detecting unit 404, and a spectrum analyzer 406, a channel-parameter detecting unit 408, a channel scan/control unit 410, and a demodulation unit 412. Except for the tuner 402, other devices are installed in a baseband processor. The channel-parameter detecting unit 408 and the channel scan/control unit 410, which are not constrained to be hardware circuits, can be implemented as drivers. Please notice that systematic structure of the receiver 400 according to the present invention is similar to that of a prior-art receiver with a little modification so that functions of the present invention can still be achieved under the original structure. The operations related to the above-mentioned devices will be detailed in the following paragraphs.

The tuner 402 at least includes a signal amplifier 420, a mixer 422, and a low-pass filter (LPF) 424. According to the present invention, the circuit structure and the operating principles of the tuner 402 are almost the same as the prior-art tuner. Since the frequency domain of the wireless/wiring satellite TV spreads broadly (for instance, the frequency range of the satellite signal varies from 950 MHz to 2150 MHz) while the frequency range scanned once by the baseband processor is seriously constrained within a much narrower range (for instance, in a satellite receiver, the predetermined bandwidth for each scan is $[-f_{sample}/2, f_{sample}/2]$, and the $f_{sample}$ is generally 90 MHz), the channel scan/control unit 410 of the baseband processor can be used to generate a bandwidth control signal to the tuner 402 to control the tuner 402 to adopt a predetermined bandwidth, such as 45 MHz ($f_{sample}/2$), as the frequency range for each scan so as to sequentially check the positions at which the received signal RS are located in frequency domain. Therefore, the frequency domain can be completely scanned by the signal scanning operation. In other words, the frequency spectrum of the received signal can be divided into a plurality of frequency bands with a bandwidth of 45 MHz and all the frequency bands will be checked whether they hold the received signal RS in sequence so that the whole frequency spectrum can be completely scanned.

Even though the signal may occupy a very broad frequency range, each channel only contains a limited frequency range (bandwidth); that is, most of the frequency domain does not contain the signal. Therefore, when there is no signal in the frequency range for a specific scan, the system can skip without performing any frequency-spectrum scanning operation to save time. For instance, the present embodiment can utilize the signal detecting unit 404 to execute a gain control operation in the baseband processor to determine the frequency range containing the signal. Please refer to FIG. 2. The signal detecting unit 404 at least includes an analog-to-digital converter (ADC) 426, an auto-gain controller (AGC) 428, a digital-to-analog converter (DAC) 430, and a signal detecting circuit 432. The analog-to-digital converter 426, the auto-gain controller 428, and the digital-to-analog converter 430 have the same characteristics as the prior-art devices. In brief, when the auto-gain controller 428 outputs a high-gain signal according to the intensity of the received signal, the frequency range (during this scanning operation) does not hold the received signal. In the meantime, the signal detecting circuit 432 can be used to output a signal to the channel scan/control unit 410 to directly control the tuner 402 to move the scanning range to the next frequency band. Therefore, the spectrum analyzer 406 and the channel-parameter detecting unit 408 do not require any frequency-spectrum scanning operation and signal processing operation toward the signal located in the frequency band. On the other hand, when the auto-gain controller 428 outputs a low-gain signal according to the intensity of the received signal, the frequency range (during this scanning operation) holds the received signal RS. Therefore, the spectrum analyzer 406 and the channel-parameter detecting unit 408 have to perform the frequency-spectrum scanning operation and advanced signal processing operation toward the signal located in the frequency band.

The spectrum analyzer 406 is used to transform the received signal RS from a time-domain signal into a frequency-domain signal to proceed with a frequency spectrum analysis to acquire the frequency response of the received signal RS. The transformation (from the time-domain signal into the frequency-domain signal) requires a Fast-Fourier transform (FFT) circuit, which occupies a great part of the circuit area and raises the cost. In the receiver according to the present invention, we can utilize the original circuit added with a device, which is used to average the energy, to scan the energy magnitudes of the received signal corresponding to a plurality of frequencies during different periods. Please refer to FIG. 3, which is a functional block diagram of an embodiment of a spectrum analyzer according to the present invention. The spectrum analyzer 32 includes an adjustable down-converter 31 and a magnitude analysis generator (MAG) 37. The adjustable down-converter 31 can be implemented by a prior-art complex down-converter 33 combined with an average unit 35. When the received signal RS passes the spectrum analyzer 32, the complex down-converter 33 can be used to adjust an operating frequency in sequence so that each energy magnitude of the received signal RS corresponding to each frequency in frequency domain can be scanned. Afterwards, the average unit 35 can be used to average the scanned energy magnitudes of the received signal RS corresponding to frequencies during different periods of time, and then the magnitude analysis generator 37 analyzes phase of the received signal to acquire the frequency response of the received signal RS. The average unit 35 can be implemented with a low-pass filter. Please refer to FIG. 2. The prior-art receiver is initially installed with a complex down-converter 434 coupled to the demodulation circuit 412. The demodulation circuit 412 can be used to output a carrier recovery signal to the down-converter 434 to perform a carrier recovery function according to the carrier recovery circuit 440. Therefore, in the present embodiment, the spectrum analyzer 406 includes a frequency control circuit 414 and a multiplexer 416. When performing the channel-scanning operations, a switch signal SW can be used to switch the multiplexer 416 so that the frequency control circuit 414 is coupled to the complex down-converter 434 to appropriately adjust the operating frequency of the complex down-converter 33; that is, the complex down-converter 33 can hold the frequency-spectrum scanning function to form the adjustable down-converter 31 according to the present invention. Operations of the frequency control circuit 414 depend on the channel scan unit 410.

Figure 3:
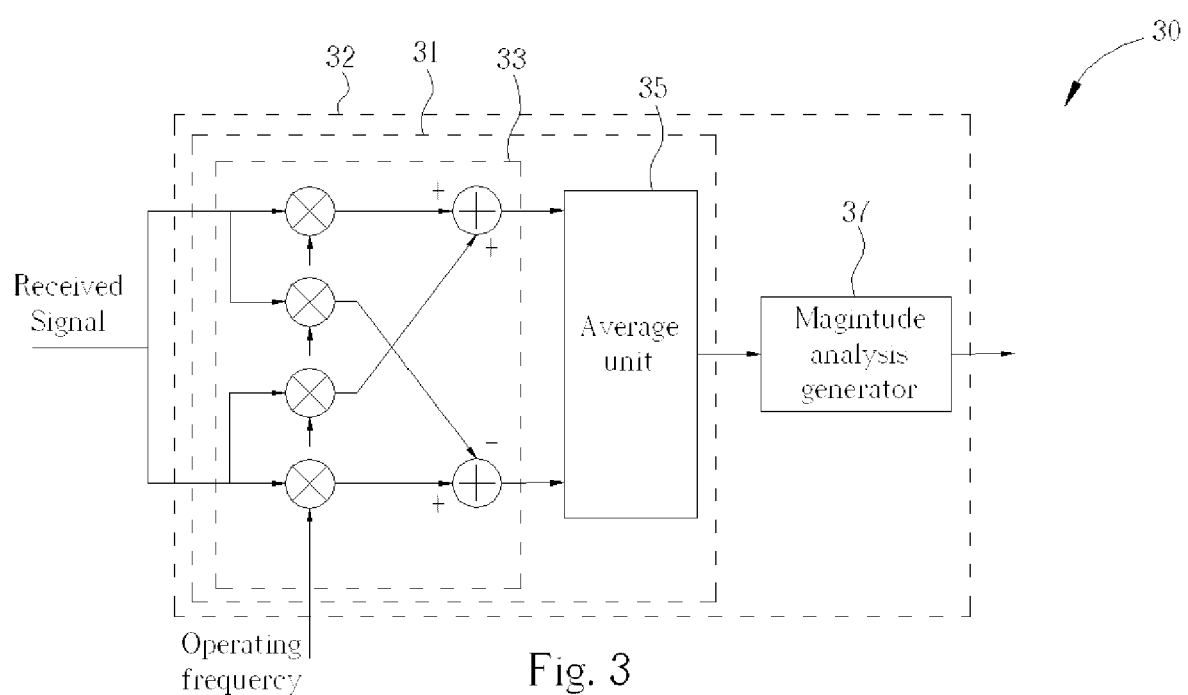
FIG. 3 is a functional block diagram of an embodiment of a spectrum analyzer according to the present invention.

However, the frequency response corresponding to a specific channel of the signal generated by the structure shown in FIG. 3 seriously fluctuates so that the characteristic parameters of the channel are not easily extracted. In order to solve the problem, we can utilize the average unit 35 shown in FIG. 3 to collect more values corresponding to each specific frequency for averaging to enhance the edge values of the channel to determine the maximum edge frequency fu and the minimum edge frequency fd. However, the above-mentioned method takes more time. Therefore, the channel-parameter detecting unit 408 of the present embodiment includes a memory 444, a low-pass filter 446, and a high-pass filter 448 to process the frequency response of the received signal RS to efficiently acquire the accurate maximum and minimum edge frequencies fu, fd. The low-pass filter 446 can be used to reduce the fluctuation amount of the frequency response to purify the frequency response of the received signal RS. Afterwards, the high-pass filter 448 can be used to generate the edge frequencies of the frequency response of the received signal, such as the maximum edge frequency fu and the minimum edge frequency fd shown in FIG. 1. After the maximum and minimum edge frequencies fu, fd of the received signal RS are generated, the channel-parameter detecting circuit 450 can be used to determine the parameters, including the position of the carrier and the symbol rate, according to above-mentioned equations.

The channel scan/control circuit 410 can be used to control the operating frequency of the complex down-converter 434 and to choose the frequency band of the mixer 422 of the tuner 402 for each scan according to the output signals of the signal detecting unit 432 and the channel-parameter detecting circuit 450 via the frequency control circuit 414 of the spectrum analyzer 406. The related operations have been mentioned in the above paragraphs.

Figure 4:
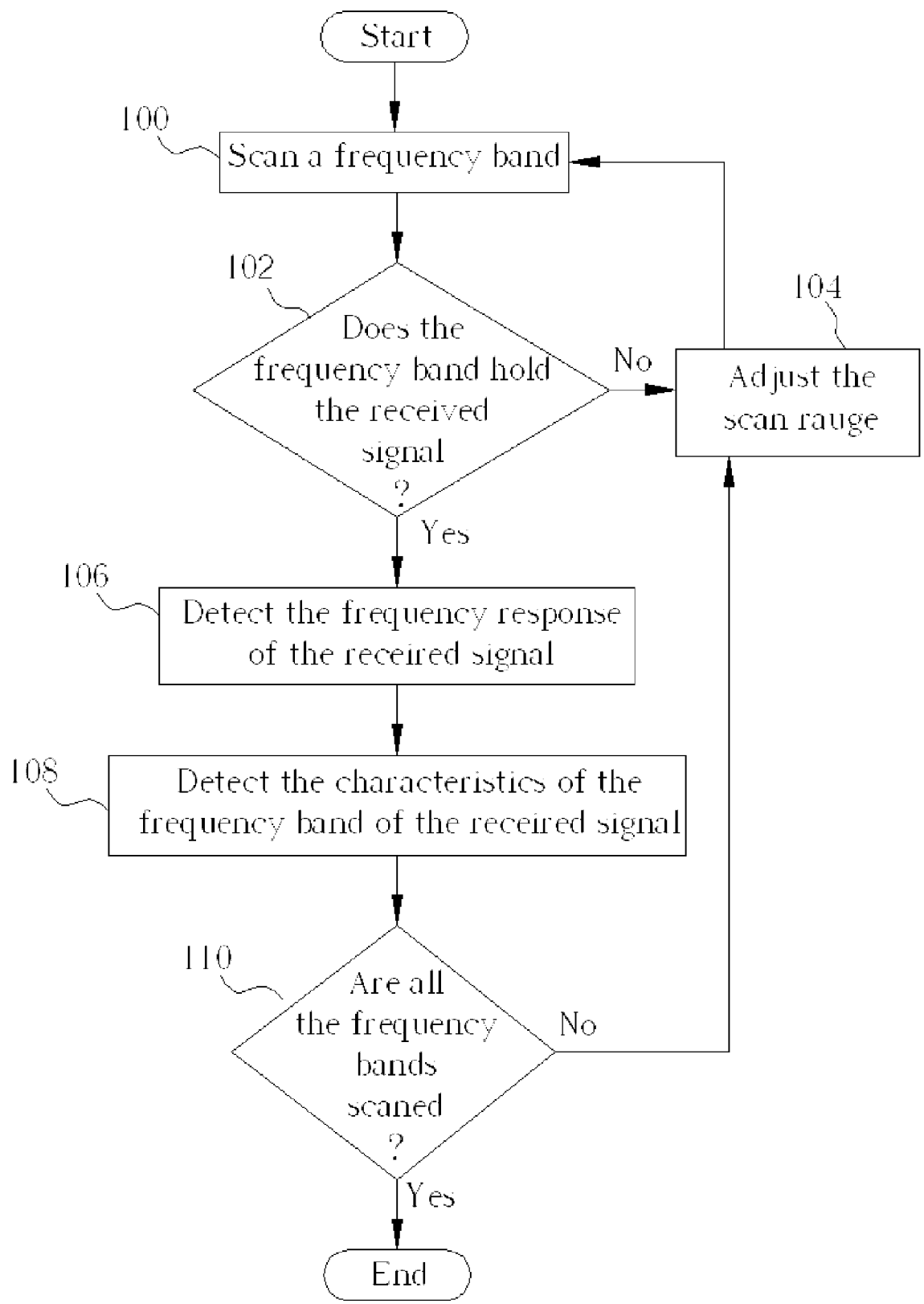
FIG. 4 is a flow chart of an embodiment of an automatic channel scanning method according to the present invention.

Please refer to FIG. 4, which is a flow chart of an embodiment of an automatic channel scanning method according to the present invention.

Step 100: utilize the tuner to scan a frequency band according to a scan frequency;

Step 102: check whether the frequency band holds the received signal. If the frequency range of the frequency band contains the received signal, proceed with Step 106; otherwise, proceed with Step 104;

Step 104: adjust a frequency range for the next scan; go to Step 100;

Step 106: utilize the spectrum analyzer to transform the received signal into a frequency-domain signal and scan the frequency response of the received signal RS in frequency domain; the detailed step can be described as follows: adjust the operating frequency of the adjustable down-converter to scan energy magnitudes of the received signal RS corresponding to a plurality of frequencies in frequency domain during different periods of time, and average the energy magnitudes corresponding to each frequency to acquire the frequency response of the received signal RS;

Step 108: utilize the channel-parameter detecting unit to detect the channel parameters of the channel related to the received signal RS; in the preferred embodiment, the frequency response of the received signal can be processed in advance;

Step 110: check whether all the frequency bands are scanned. If all the frequency bands are scanned, the procedure is finished; otherwise, proceed with Step 100 after Step 104 is executed to adjust the frequency range.

The method and related apparatus of the present invention can be used to quickly scan the frequency response of the channel to be searched, and then various characteristic parameters of the channel can be determined to efficiently finish the channel searching/scanning operation.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A method for performing channel scanning, comprising:
   scanning a plurality of frequency bands; and
   analyzing at least one of the frequency bands to determine if the frequency band holds a received signal, if it does:
      detecting a frequency response of the received signal, comprising:
      detecting energy magnitudes of the received signal corresponding to a plurality of frequencies;
      generating an averaging result according to the energy magnitudes; and
      acquiring the frequency response of the received signal according to the averaging result; and
      detecting a characteristic of a channel according to the frequency response of the received signal;
   wherein the received signal corresponds to the channel.

2. The method of claim 1 wherein frequency ranges of the plurality of frequency bands are different.

3. The method of claim 1 wherein bandwidth of each frequency band is the same.

4. The method of claim 1 wherein the characteristic of the channel at least comprises an edge frequency of the channel, a carrier frequency of the channel, and a symbol rate of the channel.

5. A receiver for performing channel scanning, comprising:
   a tuner for scanning a plurality of frequency bands in sequence;
   a signal detecting unit for analyzing at least one of the frequency bands to determine if the frequency band holds a received signal;
   a spectrum analyzer for detecting a frequency response of the received signal, comprising:
      a down-converter for detecting energy magnitudes of the received signal corresponding to a plurality of frequencies;
      an average unit for generating an averaging result according to the energy magnitudes; and
      a magnitude analysis generator for acquiring the frequency response of the received signal according to the averaging result; and
   a channel-parameter detecting unit for detecting a characteristic of a channel according to the frequency response of the received signal;
   wherein the received signal corresponds to the channel.

6. The receiver of claim 5 wherein frequency ranges of the plurality of frequency bands are different.

7. The receiver of claim 6 wherein the tuner further comprises a mixer, and the tuner determines the plurality of scanned frequency bands according to a scan frequency of the mixer.

8. The receiver of claim 7 wherein the receiver further comprises a control circuit for controlling the scan frequency of the mixer according to the received signal.

9. The receiver of claim 5 wherein the signal detecting unit further comprises an auto-gain controller for adjusting a signal gain of the receiver, and the signal detecting unit detects whether the frequency band holds the received signal according to the signal gain.

10. The receiver of claim 5 wherein the average unit is a low-pass filter.

11. The receiver of claim 5 wherein the receiver further comprises a control circuit for controlling the operating frequency of the down-converter according to the frequency response of the received signal.

12. The receiver of claim 5 wherein the channel-parameter detecting unit further comprises:
   a signal processing module for processing the frequency response of the received signal; and
   a channel-parameter detecting circuit for determining the characteristic of the channel according to the processed frequency response of the received signal.

13. The receiver of claim 12 wherein the signal processing module at least comprises:
   a low-pass filter; and
   a high-pass filter respectively coupled to the low-pass filter and the channel-parameter detecting circuit.

14. The receiver of claim 5 wherein the characteristic of the channel at least comprises an edge frequency of the channel, a carrier frequency of the channel, and a symbol rate of the channel.

15. The receiver of claim 5 wherein the receiver further comprises a channel scan/control circuit for controlling the tuner to scan the plurality of frequency bands in sequence.

* * * * *